US009379360B2

(12) United States Patent
Jeong et al.

(10) Patent No.: US 9,379,360 B2
(45) Date of Patent: Jun. 28, 2016

(54) ORGANIC LIGHT EMITTING DISPLAY APPARATUS INCLUDING LOWER AND UPPER AUXILIARY ELECTRODES

(71) Applicant: SAMSUNG DISPLAY CO., LTD., Yongin, Gyeonggi-Do (KR)

(72) Inventors: Jin-Wook Jeong, Yongin (KR); Jung-Bae Song, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/093,736

(22) Filed: Dec. 2, 2013

(65) Prior Publication Data

US 2015/0021560 A1    Jan. 22, 2015

(30) Foreign Application Priority Data

Jul. 22, 2013 (KR) .................. 10-2013-0086259

(51) Int. Cl.
  *H01L 29/08*  (2006.01)
  *H01L 35/24*  (2006.01)
  *H01L 51/00*  (2006.01)
  *H01L 51/56*  (2006.01)
  *H01L 51/52*  (2006.01)

(52) U.S. Cl.
  CPC ............ *H01L 51/56* (2013.01); *H01L 51/5228* (2013.01); *H01L 51/5234* (2013.01); *H01L 2251/5315* (2013.01)

(58) Field of Classification Search
  None
  See application file for complete search history.

(56) References Cited

U.S. PATENT DOCUMENTS

| 2007/0228937 | A1* | 10/2007 | Akiyoshi ............ H01L 27/3246 313/503 |
| 2009/0096371 | A1* | 4/2009 | Matsudate et al. ............ 313/505 |
| 2009/0130788 | A1 | 5/2009 | Koo et al. |
| 2010/0019660 | A1* | 1/2010 | Lee ..................... H01L 51/5203 313/504 |
| 2010/0127264 | A1* | 5/2010 | Bang et al. ...................... 257/59 |
| 2013/0009177 | A1* | 1/2013 | Chang et al. .................... 257/88 |

FOREIGN PATENT DOCUMENTS

| JP | 2003-123988 | 4/2003 |
| JP | 2008-041341 | 2/2008 |
| KR | 1020050034427 | 4/2005 |
| KR | 1020070117363 | 12/2007 |

OTHER PUBLICATIONS

US Publication No. 20090130788 corresponds to KR Publication No. 10-2005-0034427.

* cited by examiner

*Primary Examiner* — Mohammad Islam
*Assistant Examiner* — Jay C Chang
(74) *Attorney, Agent, or Firm* — F. Chau & Associates, LLC

(57) ABSTRACT

An organic light emitting display apparatus includes a plurality of first electrodes disposed in each of a plurality of pixels on a substrate, a plurality of lower auxiliary electrodes insulated from the first electrodes and in which the lower auxiliary electrodes are disposed in a first direction, an organic layer disposed on the first electrodes, and a second electrode facing the first electrodes and covering the organic layer. The second electrode is disposed on substantially an entire surface of the substrate. The organic light emitting display apparatus further includes a plurality of upper auxiliary electrodes disposed on the second electrode in a second direction.

5 Claims, 12 Drawing Sheets

ORGANIC LIGHT EMITTING DISPLAY APPARATUS INCLUDING LOWER AND UPPER AUXILIARY ELECTRODES

CROSS-REFERENCE TO RELATED APPLICATIONS

This application claims priority to Korean Patent Application No. 10-2013-0086259, filed on Jul. 22, 2013, the disclosure of which is hereby incorporated by reference herein in its entirety.

TECHNICAL FIELD

Exemplary embodiments of the present invention relate to an organic light emitting display apparatus and a method for manufacturing the same.

DISCUSSION OF THE RELATED ART

Organic light emitting display apparatuses may have wider viewing angles, better contrast characteristics, and faster response speeds than other display devices, and thus have drawn attention as a next-generation display apparatus.

Such an organic light emitting display apparatus includes an organic layer including an emissive layer between first and second electrodes that are opposite to each other. The second electrode may serve as a common electrode, which should apply the same voltage to all pixels. However, different levels of voltages may be applied to the pixels according to positions of the pixels due to voltage drop (e.g., IR drop) caused by high resistivity of the second electrode.

Particularly, in top-emission type organic light emitting display apparatuses, the second electrode may function as a transmitting layer. Thus, the second electrode may be formed of a transparent material having high resistivity and a thin thickness to increase light transmittance. As a result, the voltage drop in the second electrode may increase due to the high resistivity. Particularly, in case of large-sized top-emission type organic light emitting display apparatuses, the voltage drop in the second electrode may be more intensified to cause non-uniformity in image quality and characteristics in the display apparatuses.

SUMMARY

Exemplary embodiments of the present invention include an organic light emitting display apparatus that is suitable for use in the mass production of a large substrate and reduces voltage drop in a second electrode while giving benefits of top emission.

According to an embodiment of the present invention, an organic light emitting display apparatus includes: a plurality of first electrodes disposed in each of a plurality of pixels on a substrate, a plurality of lower auxiliary electrodes insulated from the first electrodes, and in which the lower auxiliary electrodes are disposed in a first direction, an organic layer disposed on the first electrodes, and a second electrode facing the first electrodes and covering the organic layer. The second electrode is disposed on substantially an entire surface of the substrate. In addition, the organic light emitting display apparatus further includes a plurality of upper auxiliary electrodes disposed on the second electrode in a second direction.

The second direction may be perpendicular to the first direction.

The lower auxiliary electrodes may be disposed in a line shape in the first direction, and the upper auxiliary electrodes may be disposed in a line shape in the second direction to cross the lower auxiliary electrodes.

The lower auxiliary electrodes may contact the second electrode in a region in which the lower auxiliary electrodes cross the upper auxiliary electrodes.

The lower auxiliary electrodes may be disposed on a same layer as the first electrodes.

The organic light emitting display apparatus may further include a pixel define layer disposed between the first electrodes, and the second electrode may contact each of the lower auxiliary electrodes through a contact hole in the pixel define layer.

The organic layer may be a plurality of organic layers disposed on the first electrodes in a line shape, and the lower auxiliary electrodes may be disposed in a line shape in a direction crossing the organic layers, and the upper auxiliary electrodes may be disposed in a line shape between the organic layers adjacent to each other.

According to an embodiment of the present invention, an organic light emitting display apparatus includes: a plurality of pixels each including a first electrode, a second electrode opposite to the first electrode, and an organic layer disposed between the first and second electrodes, a plurality of lower auxiliary electrodes disposed under the second electrode and contacting the second electrode, and in which the lower auxiliary electrodes are disposed between at least one pixel column. The organic light emitting display further includes a plurality of upper auxiliary electrodes disposed on the second electrode and contacting the second electrode. The upper auxiliary electrodes are disposed between at least one pixel row.

The lower auxiliary electrodes may be disposed in a line shape between the at least one pixel column, and the upper auxiliary electrodes may cross the lower auxiliary electrodes and be disposed in a line shape between the at least one pixel row.

The lower auxiliary electrodes may be disposed on a same layer as the first electrode, and the second electrode may contact each of the lower auxiliary electrodes through a contact hole in an insulating layer that is disposed on the first electrode and the lower auxiliary electrodes.

According to an embodiment of the present invention, a method for manufacturing an organic light emitting display apparatus includes: forming a plurality of first electrodes in each of a plurality of pixels on a substrate, forming a plurality of lower auxiliary electrodes insulated from the first electrodes and in a first direction, forming a plurality of organic layers on the first electrodes, forming a second electrode facing the first electrodes and covering the organic layer on substantially an entire surface of the substrate, and forming a plurality of upper auxiliary electrodes on the second electrode in a second direction.

The second direction may be perpendicular to the first direction.

The lower auxiliary electrodes may be disposed in a line shape in the first direction, and the upper auxiliary electrodes may be disposed in a line shape in the second direction and cross the lower auxiliary electrodes.

The lower auxiliary electrodes may contact the second electrode in a region in which the lower auxiliary electrodes cross the upper auxiliary electrodes.

The lower auxiliary electrodes may be disposed on a same layer as the first electrodes.

The method may further include forming a pixel define layer between the first electrodes, and the second electrode may contact each of the lower auxiliary electrodes through a contact hole in the pixel define layer.

The forming of the organic layers may include continuously forming organic layers on the first electrodes, in which the forming of the lower auxiliary electrodes may include forming the lower auxiliary electrodes in a line shape in a direction crossing the organic layers, and the forming of the upper auxiliary electrodes may include forming the upper auxiliary electrodes in a line shape between the organic layers adjacent to each other.

The forming of the organic layers may include: disposing the substrate so that the substrate is spaced a distance from an organic layer deposition apparatus, and patterning a deposition material sprayed from the organic layer deposition apparatus on the substrate through a pattern slit sheet to form the organic layers while one of the organic layer deposition apparatus and the substrate is moved with respect to the pattern slit sheet.

The forming of the lower auxiliary electrodes may include patterning a deposition material sprayed from the organic layer deposition apparatus on the substrate through a pattern slit sheet to form the lower auxiliary electrodes while one of the organic layer deposition apparatus and the substrate is moved with respect to the pattern slit sheet.

The forming of the upper auxiliary electrodes nay include: rotating the substrate in a vertical direction, and patterning a deposition material sprayed from the organic layer deposition apparatus on the substrate through a pattern slit sheet to form the upper auxiliary electrodes while one of the organic layer deposition apparatus and the substrate is moved with respect to the pattern slit sheet.

In accordance with an exemplary embodiment of the present invention, an organic light emitting display apparatus is provided. The organic light emitting display apparatus includes a substrate, an auxiliary layer disposed on the substrate which is configured to prevent impurities from penetrating into the substrate, and a thin film transistor (TFT) disposed on the auxiliary layer.

The TFT includes an active layer, a gate electrode disposed on the active layer, wherein the active layer includes a source region and a drain region corresponding to opposing sides of the gate electrode and a channel region disposed between the source and drain regions, and a source electrode and a drain electrode disposed on the gate electrode.

In addition, the organic light emitting display apparatus further includes a first insulating layer disposed between the gate electrode and the active layer, a second insulating layer disposed between the gate electrode and the source and drain electrodes, a third insulating layer disposed on the second insulating layer and the source and drain electrodes of the TFT, a light emitting device disposed on the third insulating layer above the TFT and including a first electrode electrically connected to one of the source and drain electrodes of the TFT, a second electrode facing the first electrode, and an organic layer disposed between the first electrode and the second electrode, a fourth insulating layer covering an edge region of the first electrode and an auxiliary electrode disposed around the light emitting device in a mesh shape. The auxiliary electrode includes a plurality of lower auxiliary electrodes disposed on a same layer as the first electrode in a first direction and which are insulated from the first electrode and a plurality of upper auxiliary electrodes disposed above the lower auxiliary electrodes in a second direction perpendicular to the first direction and contacting the second electrode. The second electrode contacts an upper portion of the lower auxiliary electrodes exposed through a contact unit in the fourth insulating layer.

BRIEF DESCRIPTION OF THE DRAWINGS

Exemplary embodiments of the present invention can be understood in more detail from the following detailed description, taken in conjunction with the accompanying drawings in which.

DETAILED DESCRIPTION OF EXEMPLARY EMBODIMENTS

Hereinafter, exemplary embodiments of the present invention will be described in detail by explaining exemplary embodiments of the invention with reference to the attached drawings. Exemplary embodiments of the invention may, however, be embodied in many different forms and should not be construed as being limited to exemplary embodiments set forth herein.

It will be understood that although the terms of first and second are used herein to describe various elements, these elements should not be limited by these terms. Terms are only used to distinguish one component from other components.

The terms of a singular form may include plural forms unless referred to the contrary. The meaning of 'include' or 'comprise' specifies a property, a region, a fixed number, a step, a process, an element and/or a component but does not exclude other properties, regions, fixed numbers, steps, processes, elements and/or components.

As used herein, the term "and/or" includes any and all combinations of one or more of the associated listed items.

Exemplary embodiments of the present invention will now be described in detail with reference to the accompanying drawings.

Figure 1:
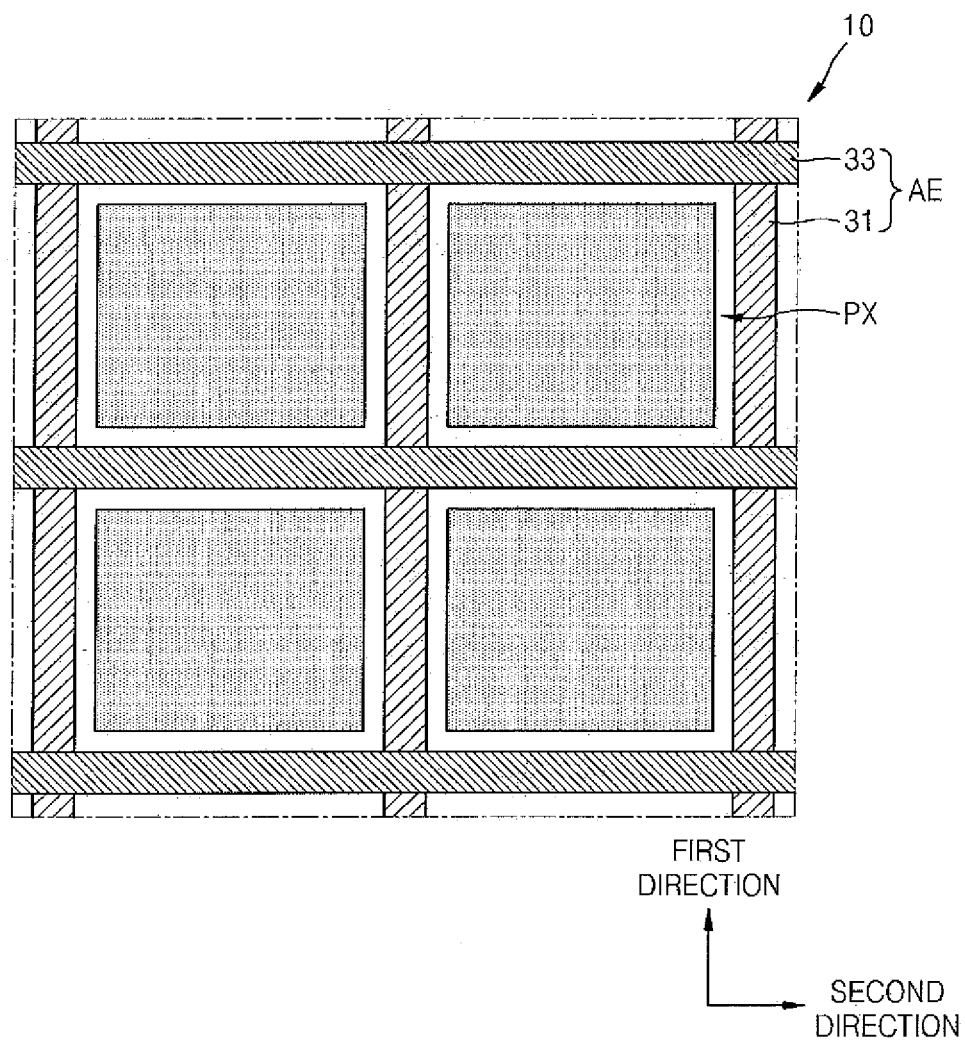
FIGS. 1 and 2 are schematic cross-sectional views of an organic light emitting display apparatus according to an embodiment of the present invention.
Figure 2:
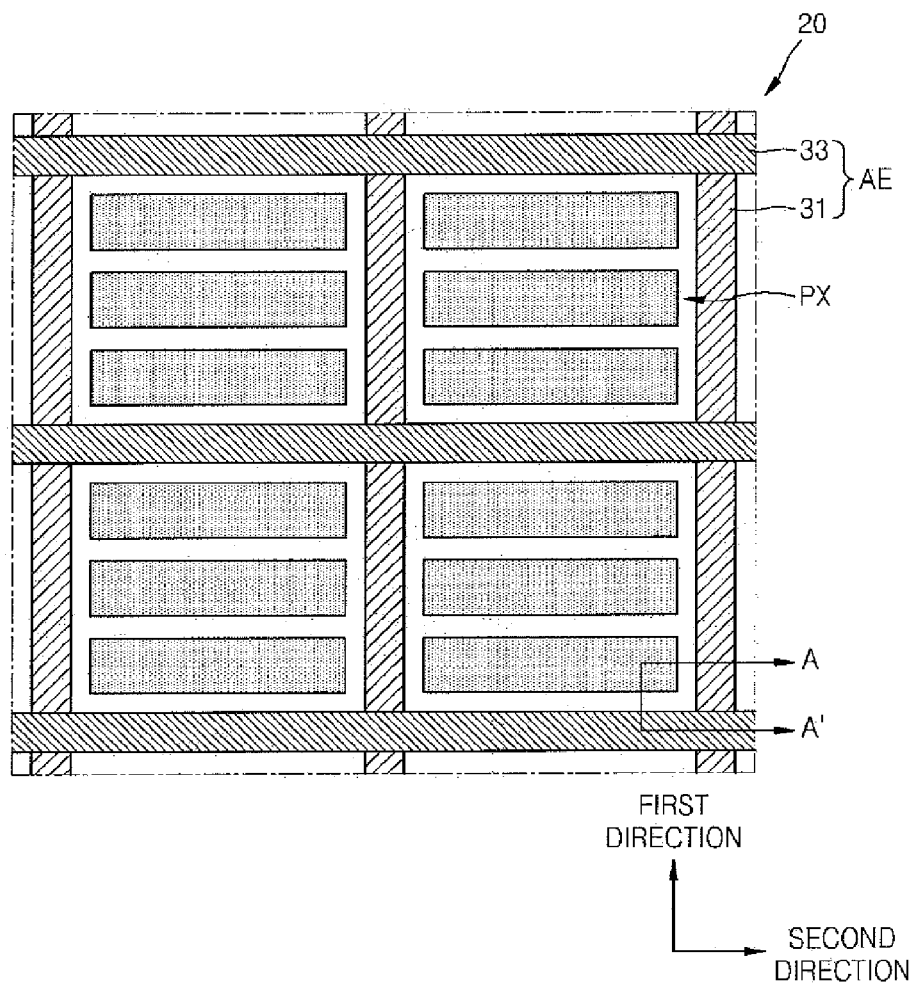

FIGS. 1 and 2 are schematic cross-sectional views of an organic light emitting display apparatus according to an embodiment of the present invention.

Referring to FIGS. 1 and 2, each of organic light emitting display apparatuses 10 and 20 may include, for example, a plurality of pixels PX that are arranged on a substrate in a matrix form in a first direction and a second direction perpendicular to the first direction. However, the pixel arrangement according to an embodiment of the present invention is not limited to the above-described structure. For example, the pixels PX are dislocated with various patterns such as a zigzag pattern. Each of the pixels PX may emit a single color such as, for example, one color of red, blue, green, and white colors. However, embodiments of the present invention are not limited thereto. For example, the pixels PX may emit other colors in addition to the red, blue, green, and white colors. The pixel PX may include, for example, a driving circuit and a light emitting device that is connected to the driving circuit to emit light. The driving circuit may include, for example, at least one thin film transistor and capacitor. The light emitting device may include, for example, a first electrode, a second electrode facing the first electrode, and an organic layer including an emissive layer between the first and second electrodes.

Auxiliary electrodes AE which are spaced apart and insulated from the first electrode may be disposed around the pixel PX. In a case of a top-emission type organic light emitting display apparatus, as light should be emitted toward the second electrode, and light transmittance should be maintained at a predetermined level or more, the second electrode may have a thin thickness. For example, in a case of a metal, a layer thickness and resistance are in inverse proportion to each other. Thus, when the top-emission type organic light emitting display apparatus is manufactured, a voltage drop may occur due to resistance of the second electrode. To solve this limitation, the auxiliary electrodes AE may be provided. The auxiliary electrodes AE may include, for example, a lower auxiliary electrode 31 and an upper auxiliary electrode 33.

The lower auxiliary electrode 31 may be provided in, for example, a line shape between at least one pixel column in one direction of the first and second directions. The upper auxiliary electrode 33 may be provided in, for example, a line shape between at least one pixel row in a direction which is perpendicular to the direction of the lower auxiliary electrode 31. FIG. 1 illustrates the lower auxiliary electrode 31 disposed in the first direction and the upper auxiliary electrode 33 disposed in the second direction which is perpendicular to the first direction. A second electrode of the light emitting device may be disposed between the lower auxiliary electrode 31 and the upper auxiliary electrode 33 to electrically connect the second electrode, the lower auxiliary electrode 31, and the upper auxiliary electrode 33 to each other.

In the organic light emitting display apparatus 10 of FIG. 1, the lower auxiliary electrode 31 is disposed between unit pixels PX, e.g., the pixel columns in the first direction, and the upper auxiliary electrode 33 is disposed between the unit pixels PX, e.g., the pixel rows in the second direction. On the other hand, in the organic light emitting display apparatus 20 of FIG. 2, the lower auxiliary electrode 31 is disposed between three unit pixels PX, e.g., the pixel columns in the first direction, and the upper auxiliary electrode 33 is disposed between three pixel rows in the second direction.

An embodiment of the present invention is not limited to the arrangement of the auxiliary electrodes AE illustrated in FIGS. 1 and 2. For example, an arrangement distance between the lower auxiliary electrodes 31 and an arrangement distance between the upper auxiliary electrodes 33 may be variously determined.

Figure 3:
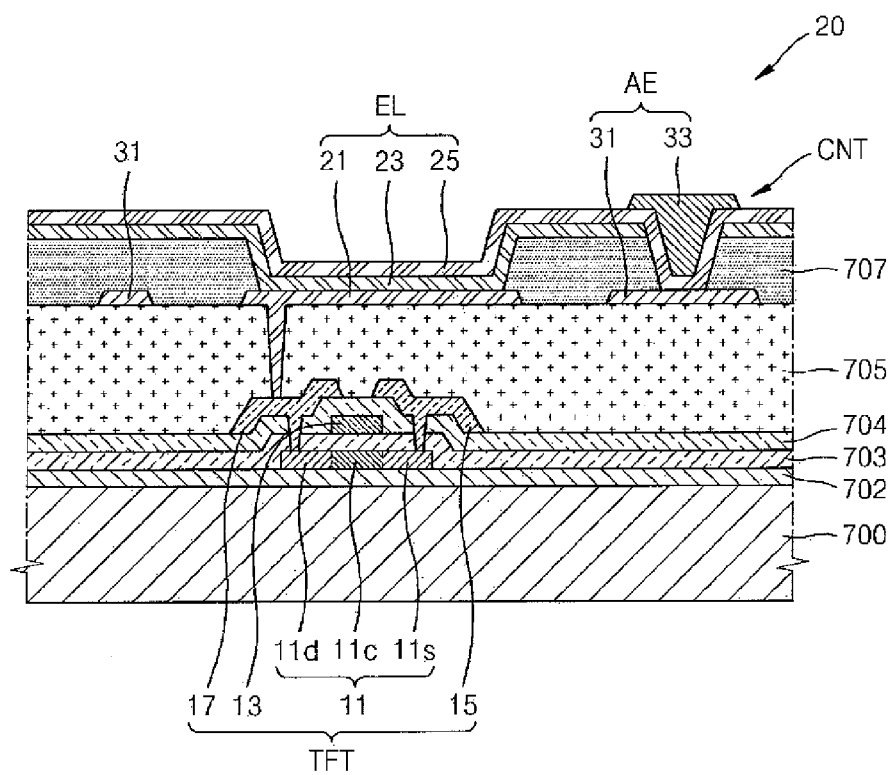
FIG. 3 is a cross-sectional view taken along line A-A' of FIG. 2.

FIG. 3 is a cross-sectional view taken along line A-A' of FIG. 2.

The cross-sectional view of FIG. 3 may be equally applied to the organic light emitting display apparatus 10 of FIG. 1.

Referring to FIG. 3, the organic light emitting display apparatus 20 may include, for example, a thin film transistor TFT that is a portion of the driving circuit, a light emitting device EL, and a contact unit CNT. Although only one thin film transistor TFT is illustrated in FIG. 3, this is merely for convenience of description and exemplary embodiments of the present invention are not limited thereto. For example, the driving circuit may include a plurality of thin film transistors TFT and a plurality of capacitors.

The thin film transistor TFT includes, for example, an active layer 11, a gate electrode 13, and source/drain electrodes 15 and 17 which are disposed on a substrate 700.

The substrate 700 may be formed of, for example, a transparent glass material that contains silicon oxide ($SiO_2$) as a main component, but exemplary embodiments of the present invention are not to limited the above-described substrate 700. For example, the substrate 700 may be formed of various materials such as a transparent plastic material, a quartz material or a metal material. For example, in an embodiment, the substrate 700 may be a flexible substrate formed of a plastic material, such as, for example, polyethyelenetereptholate (PET), polyethyelenennapthalate (PEN), polycarbonate (PC), polyallylate, polyetherimide (PEI), polyethersulphone (PES), polyimide (PI), or the like.

An auxiliary layer 702 such as, for example, a barrier layer, a blocking layer, and/or a buffer layer which prevent impurity ions from being diffused into the substrate 700, prevent moisture or external air from being penetrated into the substrate 700, and planarize a surface of the substrate 700 may be disposed on a top surface of the substrate 700. The auxiliary layer 702 may be formed by, for example, using $SiO_2$, $SiN_x$ and/or silicon oxynitride (SiON) through various deposition methods.

The active layer 11 disposed on the auxiliary layer 702 may be formed by, for example, patterning a polycrystalline silicon layer. The active layer 11 may be formed of, for example, a semiconductor. Also, the active layer 11 may contain, for example, ion impurities to be doped later. Also, the active layer 11 may be formed of, for example, an oxide semiconductor. The active layer 11 may include, for example, source/drain regions 11$s$ and 11$d$, corresponding to both sides of the gate electrode 13, in which n-type or p-type impurities are doped by using the gate electrode 13 as a self-align mask and a channel region 11$c$ defined between the source/drain regions 11$s$ and 11$d$.

The gate electrode 13 may be disposed above the active layer 11. The gate electrode 13 may be formed of various conductive materials. For example, the gate electrode 13 may be formed of, for example, at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), copper (Cu), zinc (Zn), cobalt (Co), manganese (Mn), rhodium (Rh), osmium (Os), and tantalum (Ta). Also, the gate electrode 13 may have a single layer or multilayered structure.

A first insulating layer 703 that is a gate insulating layer for insulating the gate electrode 13 from the active layer 11 may be disposed between the gate electrode 13 and the active layer 11. An inorganic insulating layer including a material such as, for example, silicon nitride ($SiN_x$), silicon oxide ($SiO_x$), silicon oxynitride (SiON), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate ($BaTiO_3$), lead titanate ($PbTiO_3$), or a combination thereof may be deposited on an entire surface of the substrate 700 by using, for example, a plasma-enhanced chemical vapor deposition (PECVD) process, an atmospheric pressure chemical vapor deposition (APCVD) process, or a low-pressure chemical vapor deposition (LPCVD) process to form the first insulating layer 703.

The source/drain electrodes 15 and 17 may be disposed above the gate electrode 13. The source/drain electrodes 15 and 17 may be formed of, for example, a material selected from the conductive materials for forming the above-described gate electrode 13. For example, in an embodiment, the source/drain electrodes 15 and 17 may be formed at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and copper (Cu), zinc (Zn), cobalt (Co), manganese (Mn), rhodium (Rh), osmium (Os), and tantalum (Ta). Also, the source/drain electrodes 15 and 17 may have a single layer or multilayered structure. However, exemplary embodiments of the present invention are not limited thereto. For example, the source/drain electrodes 15 and 17 may be formed of various conductive materials. The source/drain electrodes 15 and 17 may be electrically connected to the source/drain regions 11s and 11d of the active layer 11 through contact holes of the first insulating layer 703 and a second insulating layers layer 704, respectively.

The second insulating layer 704 may function as an interlayer insulating layer between the gate electrode 13 and the source/drain electrodes 15 and 17 of the thin film transistor TFT. The second insulating layer 704 may be formed of, for example, at least one organic insulting material selected from the group consisting of polyimide, polyamide, acrylic resin, benzocyclobutene, and phenol resin in addition to the inorganic insulating material of the first insulating layer 703. Alternatively, in an embodiment, the organic insulating material and the inorganic insulating material may be alternately stacked to form the second insulating layer 704.

A third insulating layer 705 that functions as a planarization layer for protecting and planarizing the thin film transistor TFT may be disposed above the thin film transistor TFT. The third insulating layer 705 may be formed of, for example, at least one organic insulting material selected from the group consisting of polyimide, polyamide, acrylic resin, benzocyclobutene, and phenol resin by using a spin coating method. The third insulating layer 705 may be formed of, for example, an inorganic insulating material selected from the group consisting of silicon oxide ($SiO_2$), silicon nitride ($SiN_x$), aluminum oxide ($Al_2O_3$), copper oxide ($CuO_x$), terbium oxide ($Tb_4O_7$), yttrium oxide ($Y_2O_3$), niobium pentoxide ($Nb_2O_5$), and praseodymium oxide ($Pr_2O_3$) in addition to the organic insulating materials. Also, the third insulating layer 705 may have, for example, a multilayered structure in which the organic insulating material and the inorganic insulating material are alternately stacked on each other.

The light emitting device EL may include, for example, a first electrode 21 electrically connected to one of the source/drain electrodes 15 and 17 of the thin film transistor TFT on the third insulating layer 705 disposed above the thin film transistor TFT, a second electrode 25 facing the first electrode 21, and an organic layer 23 disposed between the first electrode 21 and the second electrode 25.

The first electrode 21 may have, for example, a double-layered structure including a lower layer formed of a metal material having superior reflection efficiency such as, for example, at least one metal selected from the group consisting of Ag, Mg, Al, Pt, Pd, Au, Ni, Nd, Ir, Cr, Li, Ca, and a compound thereof and an upper layer formed of a transparent conductive material having a relatively high work function such as, for example, indium tin oxide (ITO), indium zinc oxide (IZO), zinc oxide (ZnO), indium gallium oxide (IGO), or indium oxide ($In_2O_3$).

A fourth insulating layer 707 is disposed between the first electrodes 21 adjacent to each other. The fourth insulating layer 707 may cover an edge region of the first electrode 21.

The fourth insulating layer 707 may function as a pixel define layer (PDL). The fourth insulating layer 707 may be formed of, for example, at least one organic insulating material selected from the group consisting of polyimide, polyamide, acrylic resin, benzocyclobutene, and phenol resin. The fourth insulating layer 707 may be formed of, for example, an inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$ in addition to the organic insulating materials. Also, the fourth insulating layer 707 may have, for example, a multi-layered structure in which the organic insulating material and the inorganic insulating material are alternately stacked on each other.

The organic layer 23 may include, for example, an emissive layer (EML) and at least one functional layer of a hole transport layer (HTL), a hole injection layer (NIL), an electron transport layer (ETL), and an electron injection layer (EIL) in a single or composite structure. The EML may be formed of, for example, an organic material having a low molecular weight or a high molecular weight. For example, if the EML emits light having each of red, green, and blue colors, the EML may be patterned into a red EML, a green EML, and a blue EML. If the EML emits white light, the EML may have a multilayered structure in which the red EML, the green EML, and the blue EML are stacked on each other or a single layer structure including a red emission material, a green emission material, and a blue emission material to emit the white light. In this case, a color converting layer for converting the white light into light having a predetermined color or a color filter may be applied. The functional layer may be a common layer disposed on the entire surface of the substrate 700.

The second electrode 25 may be deposited on the entire surface of the substrate 700 to form a common electrode. Here, the second electrode 25 may face the first electrode 21. The second electrode 25 may be formed of, for example, a transparent conductive material. For example, the second electrode 25 may include a semi-transparent reflection film that is provided with a thin film formed of Ag, Mg, Al, Pt, Pd, Au, Ni, Nd, Ir, Cr, Li, or Ca, or an optical transparent metal oxide such as ITO, IZO, or ZnO.

An auxiliary electrode AE is disposed around a light emitting device EL in, for example, a mesh shape. The auxiliary electrode AE may include, for example, lower auxiliary electrodes 31 disposed at a predetermined distance in a first direction and upper auxiliary electrodes 33 disposed above the lower auxiliary electrode 31 at a predetermined distance in a second direction. The fourth insulating layer 707 and the organic layer 23 which are disposed on each of the lower auxiliary electrodes 31 may be removed to expose a portion of the lower auxiliary electrode 31 in the contact unit CNT in which each of the lower auxiliary electrodes 31 and each of the upper auxiliary electrodes 33 cross each other.

The lower auxiliary electrode 31 may be disposed on, for example, the same layer as the first electrode 21 and be insulated from the first electrode 21. The lower auxiliary electrode 31 may be formed of a material which is the same as or different from the material of the first electrode 21 and/or the second electrode 25. The second electrode 25 contacts an upper portion of the exposed lower auxiliary electrode 31, The upper auxiliary electrode 33 may be disposed on the second electrode 25 and contact the second electrode 25. Thus, the auxiliary electrode AE and the second electrode 25 may be electrically connected to each other. The upper auxiliary electrode 33 may be formed of, for example, a material which is the same as or different from the material of the lower auxiliary electrode 31. For example, the upper auxiliary electrode 33 may be formed of Al, AlNd, Cu, or copper alloy which has low-resistance properties.

Figure 4:
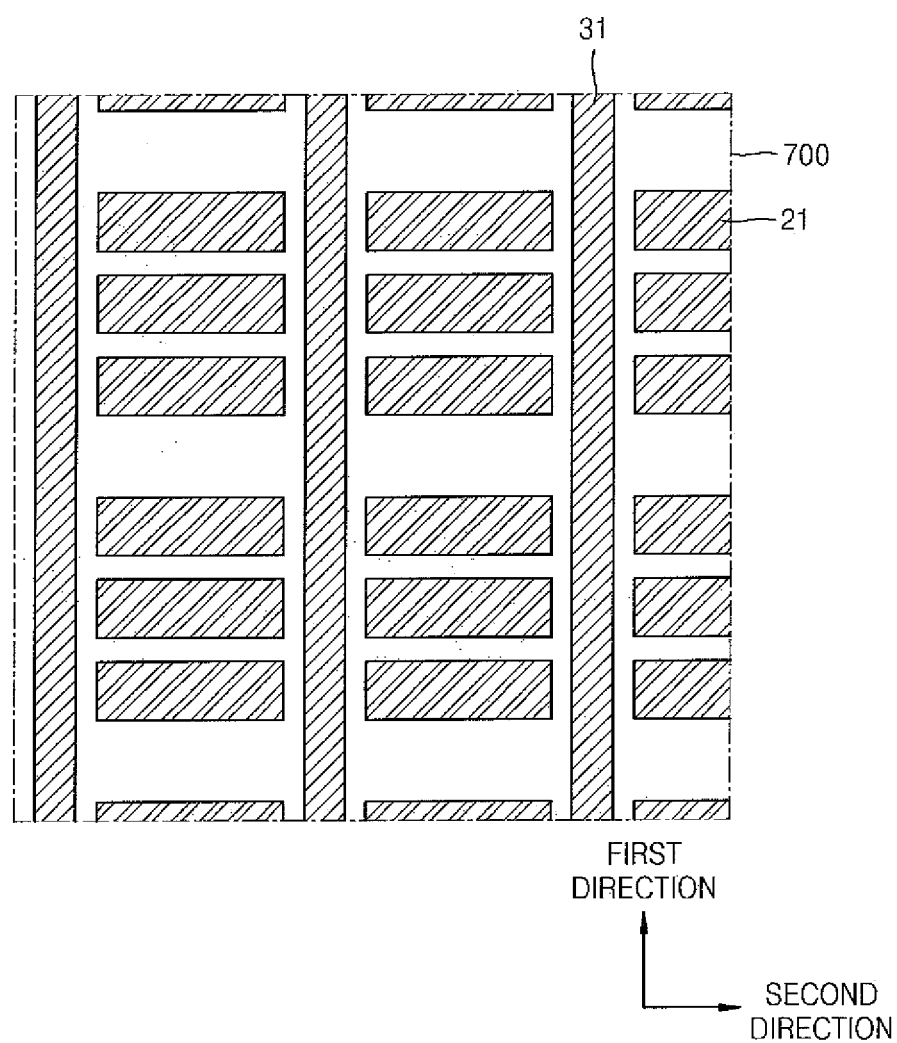
FIGS. 4 to 6 are views illustrating a method for manufacturing an organic light emitting display apparatus according to an embodiment of the present invention.
Figure 5:
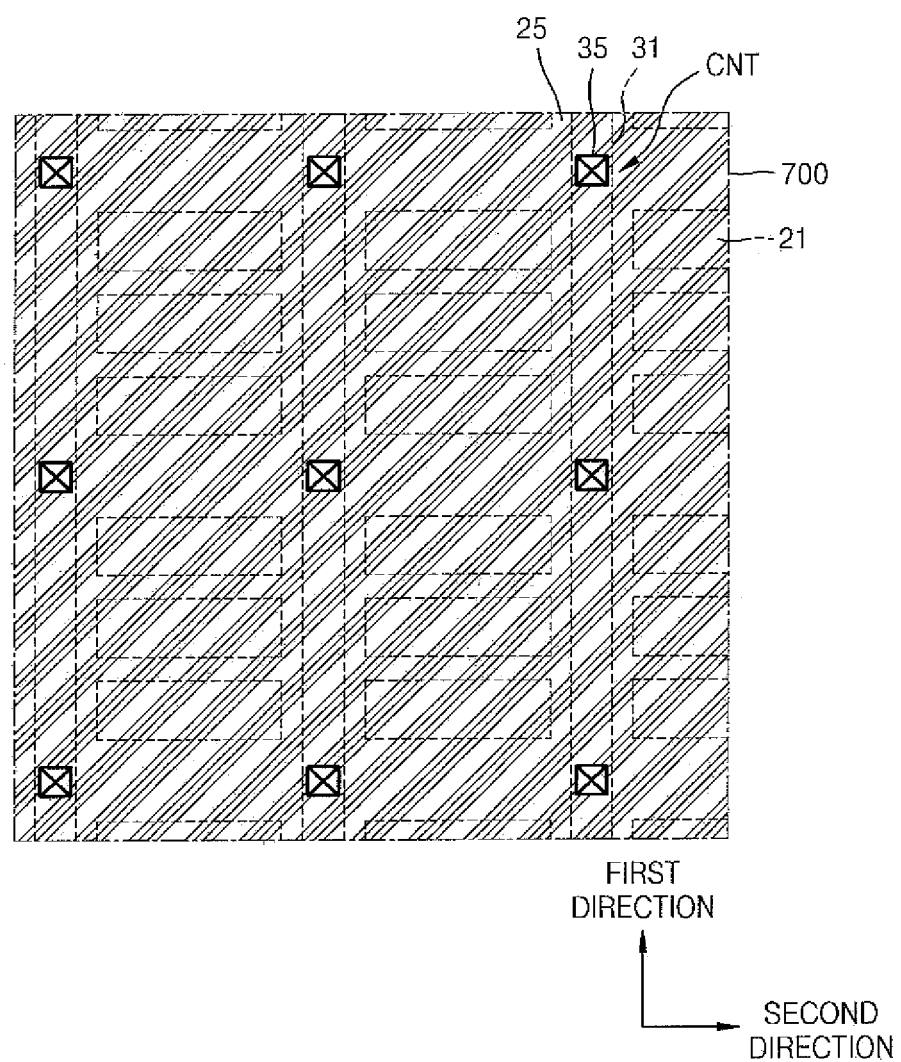
Figure 6:
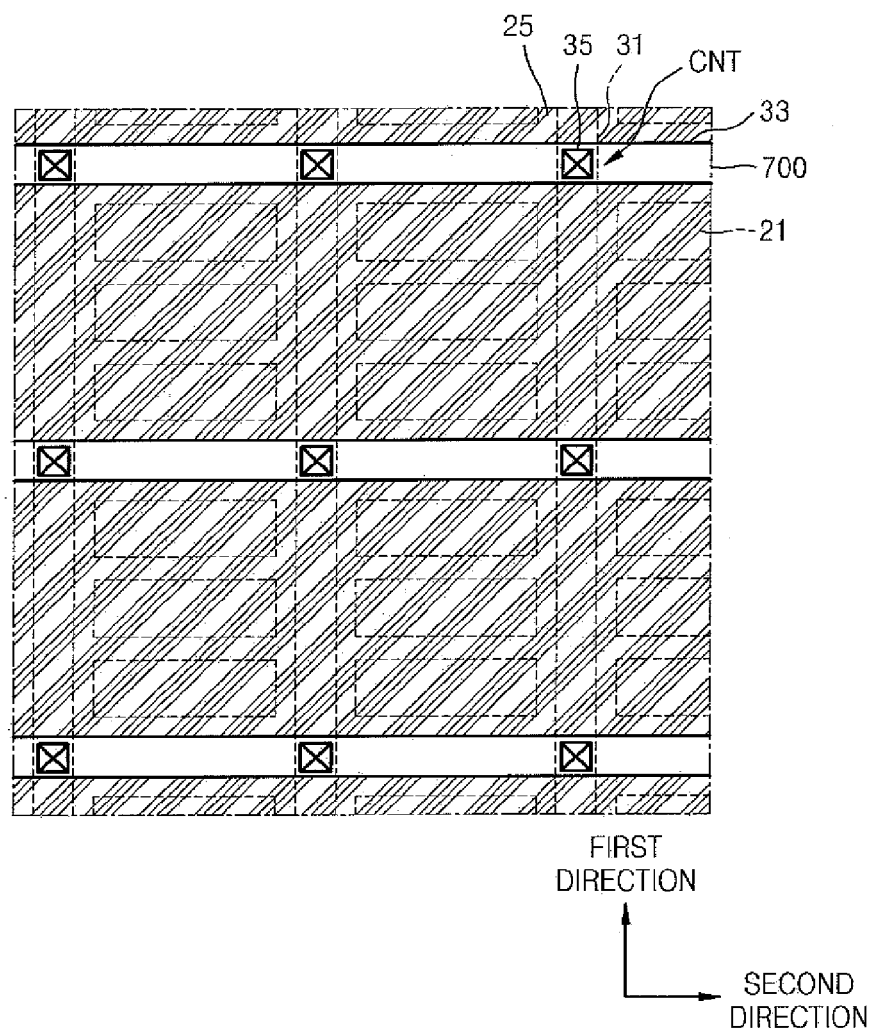

FIGS. 4 to 6 are views illustrating a method for manufacturing an organic light emitting display apparatus according to an embodiment of the present invention.

A driving circuit including a thin film transistor TFT is formed on a substrate 700.

As illustrated in FIG. 4, a lower auxiliary electrode 31 having a line shape is formed in a first direction while a first electrode 21 is formed. Alternatively, in an embodiment, the lower auxiliary electrode 31 having the line shape in the first direction may be formed after the first electrode 21 is formed. The lower auxiliary electrode 31 may be formed, for example, on the same layer as the first electrode 21.

As illustrated in FIG. 5, a second electrode 25 that is a common electrode is formed on the lower auxiliary electrode 31 and the first electrode 21.

For example, a fourth insulating layer (see reference numeral 707 of FIG. 3) that functions as a pixel define layer is formed on the auxiliary electrode 31 and the first electrode 21. An opening for exposing the first electrode 21 and a contact hole 35 for exposing the lower auxiliary electrode 31 in a contact unit CNT are formed in the fourth insulating layer 707. An organic layer (see reference numeral 23 of FIG. 3) is formed on the fourth insulating layer 707. For example, when the organic layer 23 is formed, the contact hole 35 may be covered by using a mask, or the organic layer 23 within the contact hole 35 of the contact unit CNT may be removed by using laser beams so that the organic layer 23 may not remain in the contact hole 35 of the contact unit CNT.

Also, the second electrode 25 is formed above the fourth insulating layer 707, the organic layer 23, and the lower auxiliary electrode 31. The second electrode 25 may directly contact the lower auxiliary electrode 31 through the contact hole 35 in the contact unit CNT.

As illustrated in FIG. 6, an upper auxiliary electrode 33 having, for example, a line shape is formed on the second electrode 25 in a second direction. The upper auxiliary electrode 33 directly contacts the second electrode 25 in the contact unit CNT. Therefore, the auxiliary electrode AE according to an embodiment of the present invention may have the mesh structure by the lower and upper auxiliary electrodes 31 and 33 which cross each other in the first and second directions to effectively reduce voltage drop.

Figure 7:
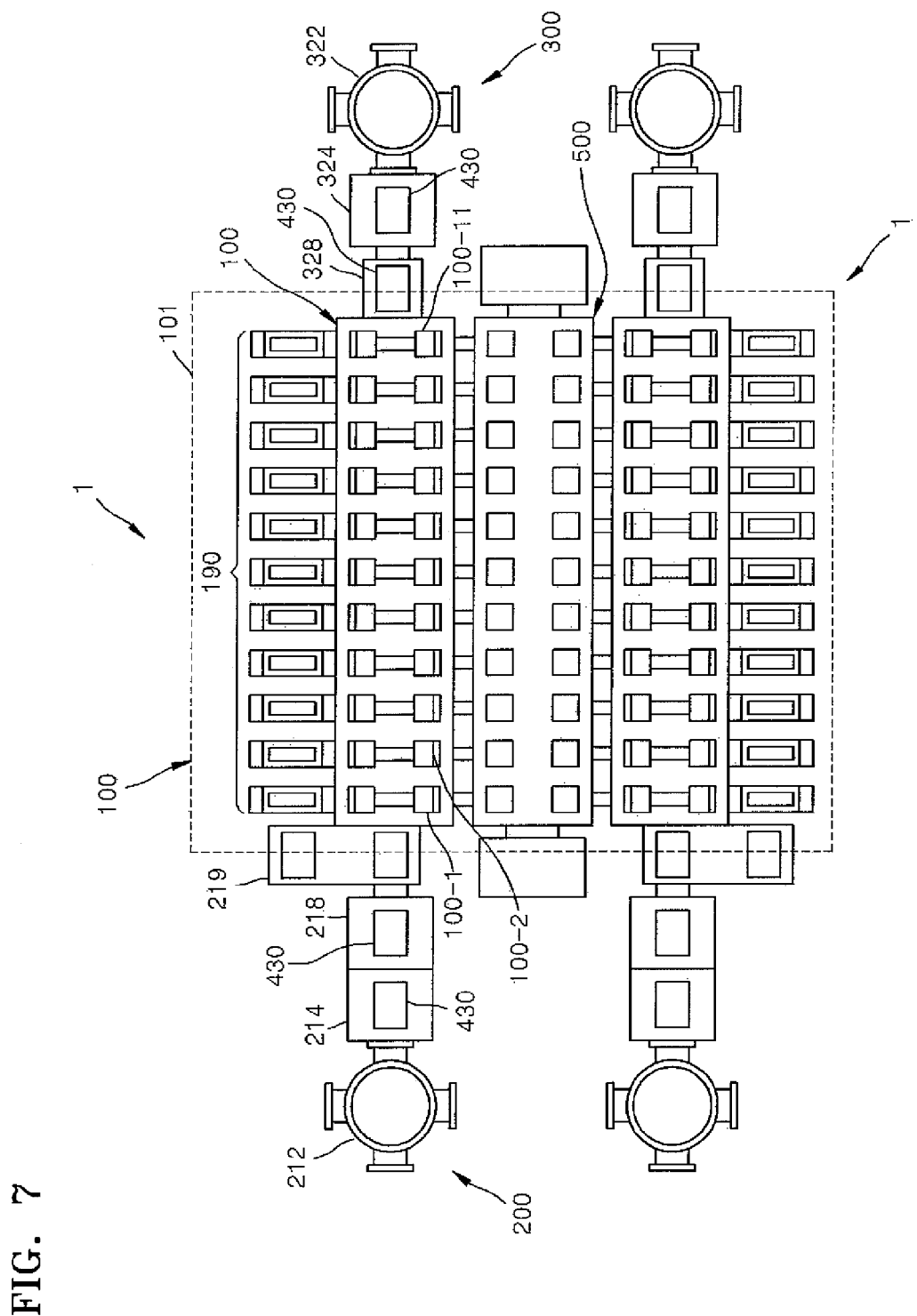
FIG. 7 is a schematic plan view of an organic layer deposition apparatus according to an embodiment of the present invention.
Figure 8:
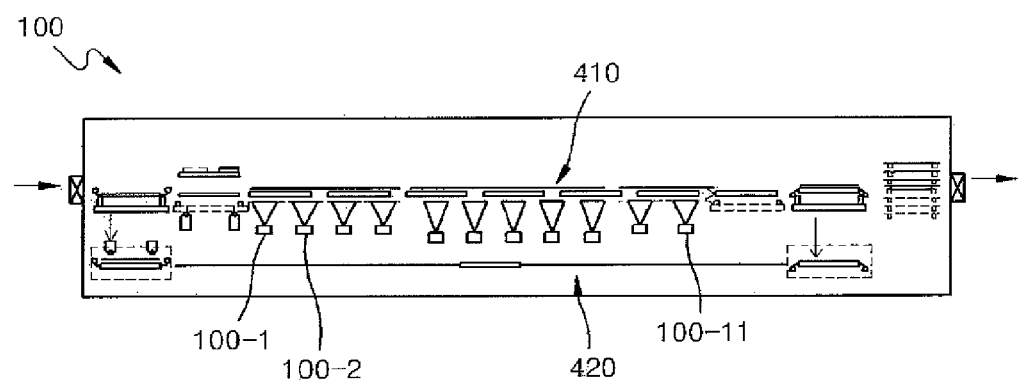
FIG. 8 is a schematic side view illustrating a deposition unit of the organic layer deposition apparatus of FIG. 7.

FIG. 7 is a schematic plan view of an organic layer deposition apparatus according to an embodiment of the present invention, and FIG. 8 is a schematic side view illustrating a deposition unit of the organic layer deposition apparatus of FIG. 7.

Referring to FIGS. 7 and 8, an organic layer deposition apparatus 1 includes, for example, a deposition unit 100, a loading unit 200, an unloading unit 300, and a conveyer unit 400.

The loading unit 200 may include, for example, a first rack 212, a transport chamber 214, a first inversion chamber 218, and a buffer chamber 219.

A plurality of substrates 700 onto which a deposition material has not yet been applied are stacked up on the first rack 212. For example, a transport robot provided in the transport chamber 214 picks up one of the substrates 700 from the first rack 212, disposes the substrate 700 on a moving unit 430 transferred by a second conveyer unit 420, and moves the moving unit 430 on which the substrate 700 is disposed into the first inversion chamber 218.

The first inversion chamber 218 is disposed adjacent to the transport chamber 214. A first inversion robot disposed in the first inversion chamber 218 inverts the moving unit 430 and then loads the moving unit 430 on a first conveyer unit 410 of the deposition unit 100.

Referring to FIG. 7, the transport robot of the transport chamber 214 places one of the substrates 700 on a top surface of the moving unit 430. In this state, the moving unit 430 on which the substrate 700 is disposed is transferred into the first inversion chamber 218. The first inversion robot of the first inversion chamber 218 inverts the first inversion chamber 218 so that the substrate 700 is turned upside down in the deposition unit 100.

The unloading unit 300 is configured to operate in an opposite manner to the loading unit 200 described above. That is, a second inversion robot in a second inversion chamber 328 inverts the moving unit 430, which has passed through the deposition unit 100 while the substrate 700 is disposed on the moving unit 430, and then moves the moving unit 430 on which the substrate 700 is disposed into an ejection chamber 324. Then, an ejection robot takes the moving unit 430 on which the substrate 700 is disposed out of the ejection chamber 324, separates the substrate 700 from the moving unit 430, and then loads the substrate 700 on a second rack 322. The moving unit 430 separated from the substrate 700 returns to the loading unit 200 via the second conveyer unit 420.

However, the present embodiment of the present invention is not limited to the above example. For example, when the substrate 700 is initially fixed to the moving unit 430, the substrate 700 may be fixed onto a bottom surface of the moving unit 430 and then moved into the deposition unit 100. In this case, for example, the first inversion robot of the first inversion chamber 218 and the second inversion robot of the second inversion chamber 328 may be omitted.

The deposition unit 100 may include, for example, at least one chamber 101 for deposition. According to an embodiment of the present invention, as illustrated in FIGS. 7 and 8, the deposition unit 100 includes, for example, a chamber 101 in which a plurality of organic layer deposition assemblies (100-1) (100-2) . . . (100-n) may be disposed. For example, referring to FIG. 8, eleven organic layer deposition assemblies, a first organic layer deposition assembly (100-1), a second organic layer deposition assembly (100-2), . . . and an eleventh organic layer deposition assembly (100-11), are disposed in the chamber 101, but the number of organic layer deposition assemblies may vary with a desired deposition material and deposition conditions. The chamber 101 is maintained, for example, in vacuum during the deposition process.

Referring to FIG. 7, the moving unit 430 with the substrate 700 fixed thereon may be moved at least to the deposition unit 100 or may be moved sequentially to the loading unit 200, the deposition unit 100, and the unloading unit 300, by the first conveyer unit 410, and the moving unit 430 that is separated from the substrate 700 in the unloading unit 300 may be moved back to the loading unit 200 by the second conveyer unit 420.

The first conveyer unit 410 passes through the chamber 101 when passing through the deposition unit 100, and the second conveyer unit 420 conveys the moving unit 430 from which the substrate 700 is separated.

Here, the organic layer deposition apparatus 1 is configured such that the first conveyer unit 410 is disposed above the second conveyer unit 420 so that after the moving unit 430, on which deposition has been completed while passing through the first conveyer unit 410, is separated from the substrate 700 in the unloading unit 300, the moving unit 430 returns to the loading unit 200 via the second conveyer unit 420 formed below the first conveyer unit 410, thereby increasing space utilization efficiency.

The deposition unit 100 of FIG. 7 may further include, for example, a deposition source replacement unit 190 disposed at a side of each organic layer deposition assembly. In an embodiment, the deposition source replacement unit 190 may be formed as, for example, a cassette-type that may be drawn to the outside from each organic layer deposition assembly. Thus, a deposition source 110 (see reference numeral 110 of FIG. 3) of the organic layer deposition assembly 100-1 may be relatively easily replaced.

FIG. 7 illustrates the organic layer deposition apparatus 1 in which two sets of structures each including, for example, the loading unit 200, the deposition unit 100, the unloading unit 300, and the conveyer unit 400 are arranged in parallel. That is, it may be seen that two organic layer deposition apparatuses 1 are arranged such that one organic layer deposition apparatus 1 is disposed above the other organic layer deposition apparatus 1 (above and below in FIG. 7). In this case, a mask replacement unit 500 may be disposed between the two organic layer deposition apparatuses 1. That is, due to this configuration of structures, the two organic layer deposition apparatuses 1 share the mask replacement unit 500, thereby resulting in increased space utilization efficiency, as compared to a case where each organic layer deposition apparatus 1 includes the mask replacement unit 500. The mask replacement unit 500 may replace an open mask and a patterning slit sheet.

Figure 9:
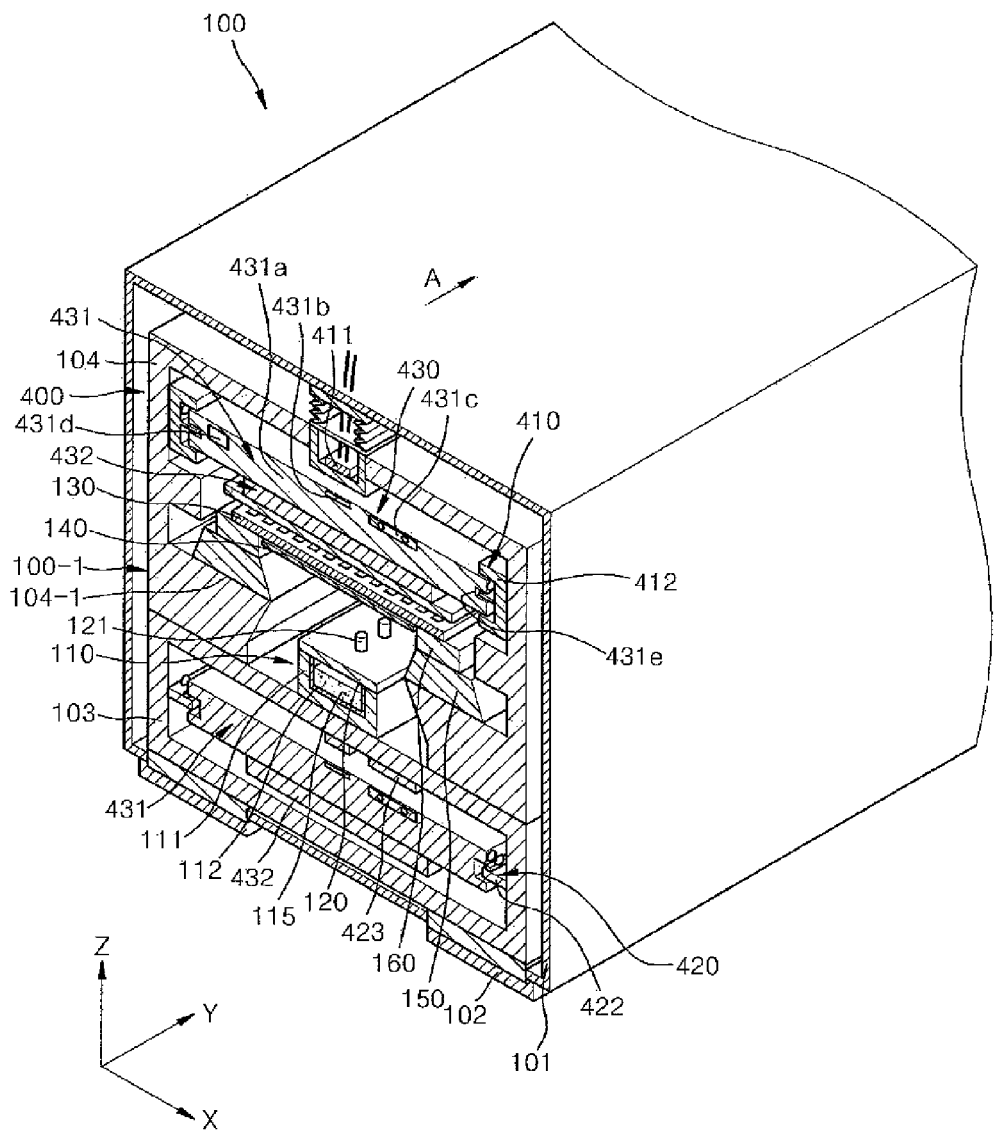
FIG. 9 is a schematic perspective view of the deposition unit of FIG. 7.
Figure 10:
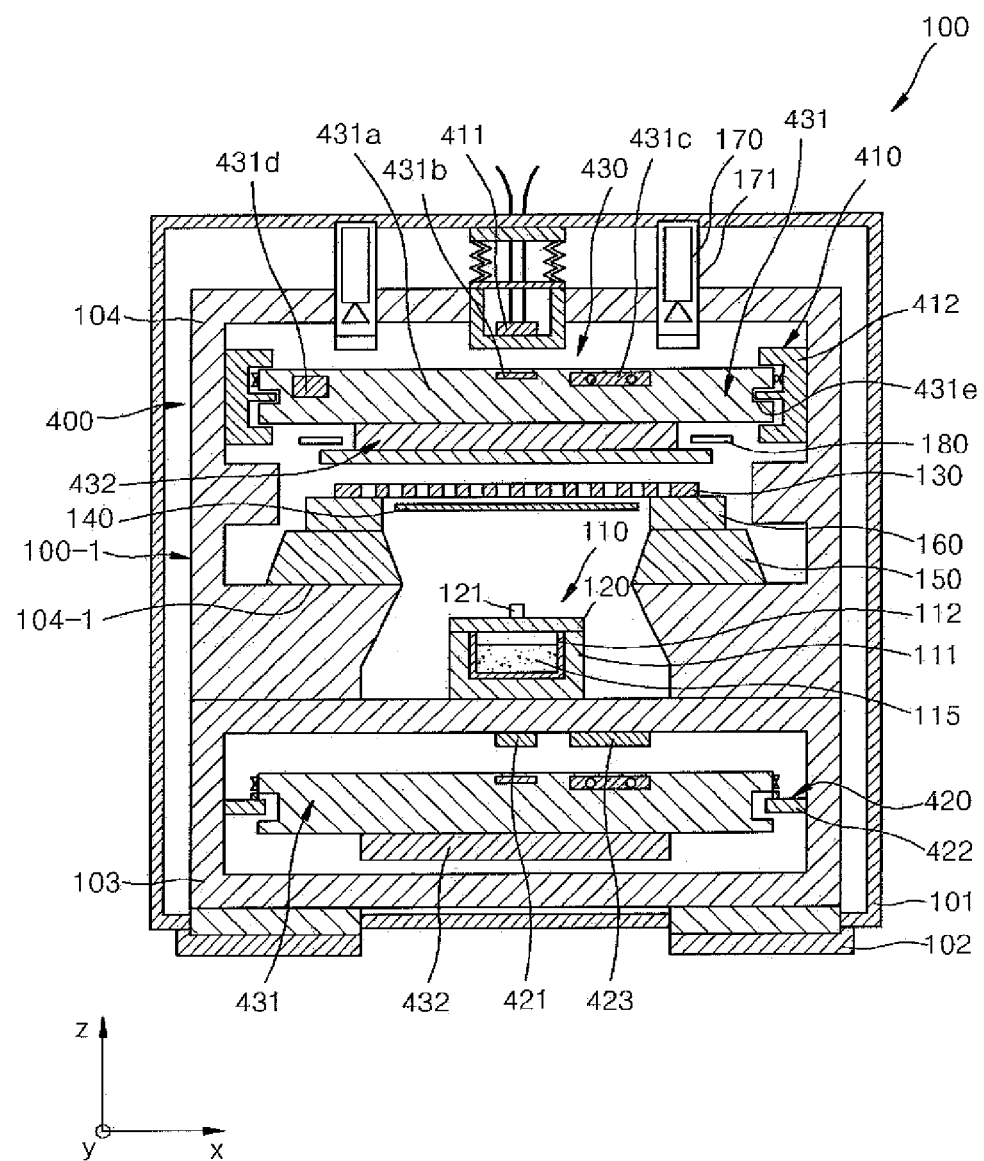
FIG. 10 is a schematic cross-sectional view of the deposition unit of FIG. 9.

FIG. 9 is a schematic perspective view of the deposition unit of FIG. 7, and FIG. 10 is a schematic cross-sectional view of the deposition unit of FIG. 9.

Referring to FIGS. 9 and 10, the deposition unit 100 of the organic layer deposition apparatus 1 includes, for example, at least one organic layer deposition assembly 100-1 and a conveyer unit 400.

Hereinafter, a structure of the deposition unit 100 including, for example, a patterning slit sheet 130 will be described.

The chamber 101 may be formed as, for example, a hollow box type and accommodate the at least one organic layer deposition assembly 100-1 and the moving unit 430. For example, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. Here, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes, for example, the organic layer deposition assembly 100-1 and the first conveyer unit 410 of the conveyer unit 400, and the lower housing 103 includes, for example, the second conveyer unit 420 of the conveyer unit 400. While the moving unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes, for example, the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 9 and 10 may be arranged in the chamber 101 maintained in an appropriate vacuum state. This structure may be needed to achieve the linearity of a deposition material.

For example, to deposit a deposition material 115 that has been discharged from the deposition source 110 and passed through the deposition source nozzle unit 120 and the patterning slit sheet 130, onto the substrate 700 in a desired pattern, the chamber should be maintained in the same vacuum state as the vacuum state used in a deposition method using a fine metal mask (FMM). In addition, the temperature of the patterning slit sheet 130 should be sufficiently lower than the temperature of the deposition source 110 because thermal expansion of the patterning slit sheet 130 may be minimized when the temperature of the patterning slit sheet 130 is sufficiently low.

The substrate 700 on which the deposition material 115 is to be deposited is arranged in the chamber 101. The substrate 700 may be, for example, a substrate for a flat panel display device. For example, a large substrate having a size of about 40 inches or more, such as a mother glass, for manufacturing a plurality of flat panel displays, may be used as the substrate 700.

According to an embodiment of the present invention, the deposition process may be performed with the substrate 700 being moved relative to the organic layer deposition assembly 100-1.

For example, in a typical deposition method using an FMM, the size of the FMM should be the same as the size of a substrate. Thus, as the size of the substrate increases, the FMM should also be larger in size. Due to these limitations, it may be difficult to fabricate the FMM and to align the FMM in a precise pattern by elongation of the FMM.

To address these limitations, in the organic layer deposition assembly 100-1 according to the present embodiment, deposition may be performed while the organic layer deposition assembly 100-1 and the substrate 700 are moved relative to each other. In other words, deposition may be continuously performed while, for example, the substrate 700, which faces the organic layer deposition assembly 100-1, is moved in a Y-axis direction. That is, deposition is performed in a scanning manner while the substrate 700 is moved in a direction of arrow A illustrated in FIG. 9. Although the substrate 700 is illustrated as being moved in the Y-axis direction in the chamber 101 in FIG. 9 when deposition is performed, it is noted that exemplary embodiments of the present invention are not limited thereto. For example, deposition may be performed while the organic layer deposition assembly 100-1 is moved in the Y-axis direction and the substrate 700 is held in a fixed position.

Thus, in the organic layer deposition assembly 100-1, the patterning slit sheet 130 may be significantly smaller than an FMM used in a conventional deposition method. That is, in the organic layer deposition assembly 100-1, deposition is continuously performed, e.g., in a scanning manner while the substrate 700 is moved in the Y-axis direction. Thus, at least one of the lengths of the patterning slit sheet 130 in X-axis and Y-axis directions may be significantly less than a length of the substrate 700. As the patterning slit sheet 130 may be formed significantly smaller than the FMM used in a typical deposition method, it may be relatively easy to manufacture the patterning slit sheet 130. That is, the small patterning slit sheet 130 is more effective in the manufacturing processes which include etching followed by precise elongation, welding, transferring, and washing processes, than the FMM used in a conventional deposition method. In addition, using the patterning slit sheet 130 of exemplary embodiments of the present invention is more effective for manufacturing a relatively large display device.

To perform deposition while the organic layer deposition assembly 100-1 and the substrate 700 are moved relative to each other as described above, the organic layer deposition assembly 100-1 and the substrate 700 may be spaced apart from each other by a certain distance. This is described below in more detail.

The deposition source 110 that contains and heats the deposition material 115 is disposed at a side opposite to (facing) a side in which the substrate 700 is disposed in the chamber. As the deposition material 115 contained in the deposition source 110 is vaporized, deposition is performed on the substrate 700.

The deposition source 110 includes, for example, a crucible 111 that is filled with the deposition material 115 and a heater 112 that heats the crucible 111 so as to vaporize the deposition material 115 toward a side of the crucible 111 filled with the deposition material 115, and in particular toward the deposition source nozzle unit 120.

A deposition source nozzle unit 120 is disposed on one side of the deposition source 10, e.g., a side toward the substrate 700 from the deposition source 110. Here, the organic layer deposition assemblies according to the present embodiment of the present invention each may include, for example, different deposition nozzles in performing deposition for forming common layers and pattern layers. That is, for example, a plurality of deposition source nozzles 121 may be provided in the deposition source nozzle unit 120 for forming a pattern layer in the Y-axis direction, e.g., along the scanning direction of the substrate 700. Thus, the deposition source nozzles 121 are formed such that, for example, only one line of the deposition source nozzles 121 is formed in the X-axis direction, to significantly reduce the occurrence of shadows. Alternatively, the plurality of deposition source nozzles 121 may be provided, for example, in the deposition source nozzle unit 120 for forming a common layer along the X-axis direction. Thus, uniformity in thickness of the common layer may be increased.

The patterning slit sheet 130 may be further disposed between the deposition source 110 and the substrate 700. The patterning slit sheet 130 may further include, for example, a frame having a shape similar to a window frame. The patterning slit sheet 130 includes, for example, a plurality of patterning slits arranged in the X-axis direction. The deposition material 115 that has been vaporized in the deposition source 110 passes through the deposition source nozzle unit 120 and the patterning slit sheet 130 and is then deposited onto the substrate 700. Here, the patterning slit sheet 130 may be formed using, for example, the same method as that used to form an FMM, and in particular a stripe-type mask, e.g., etching. In this regard, a total number of patterning slits may be, for example, more than a total number of deposition source nozzles 121.

The deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 700. For the organic layer deposition assembly 100-1 to be moved relative to the substrate 700, the patterning slit sheet 130 is disposed spaced apart from the substrate 700 by a predetermined distance.

In a typical deposition method using an FMM, deposition is performed with the FMM in close contact with a substrate to prevent formation of shadows on the substrate. However, when the FMM is formed in close contact with the substrate, defects due to the contact between the substrate and the FMM may occur. In addition, as it may be difficult to move the mask with respect to the substrate, the mask and the substrate may need to be formed having the same size as each other. Accordingly, the mask may need to be larger as the size of a display device increases. However, it may be difficult to form a large mask.

To address these limitations, in the organic layer deposition assembly 100-1 according to the present embodiment, the patterning slit sheet 130 is formed spaced apart by a certain distance from the substrate 700 on which a deposition material 115 is to be deposited.

According to the present embodiment, deposition may be performed while a mask formed smaller than a substrate is moved with respect to the substrate, and thus, it may be relatively easy to manufacture the mask. In addition, defects due to contact between the substrate and the mask may be prevented. In addition, as it is unnecessary to closely contact the substrate with the mask during a deposition process, a manufacturing speed may be increased.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 100 and the deposition source nozzle unit 120 to have, for example, a protruding shape. The first stage 150, the second stage 160, and the patterning slit sheet 130 are sequentially formed on the accommodation portions 104-1 in this order.

Here, the first stage 150 is formed to move in X-axis and Y-axis directions so that the first stage 150 aligns the patterning slit sheet 130 in the X-axis and Y-axis directions. That is, the first stage 150 includes, for example, a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes, for example, a plurality of actuators and is formed to move in the Z-axis direction with respect to the first stage 150.

The patterning slit sheet 130 is disposed on the second stage 160. As described above, the patterning slit sheet 130 is disposed on the first stage 150 and the second stage 160 so as to move in the X-axis, Y-axis, and Z-axis directions, and thus, an alignment (e.g., a real-time alignment) between the substrate 700 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be further disposed between the patterning slit sheet 130 and the deposition source 110. For example, an anode or cathode pattern is formed on an edge portion of the substrate 700 and is used as a terminal for inspecting a product or in manufacturing a product. If an organic material is applied on a region of the substrate 700, the anode or the cathode may not sufficiently perform its function. Thus, the edge portion of the substrate 700 is formed to be a non-film-forming region on which an organic material or the like is not applied. As described above, however, in the organic layer deposition apparatus, deposition is performed in a scanning manner while the substrate 700 is moved relative to the organic layer deposition apparatus, and thus, it may not be easy to prevent the organic material from being deposited on the non-film-forming region of the substrate 700.

Therefore, to prevent the organic material from being deposited on the non-film-forming region of the substrate 700, in the organic layer deposition apparatus, the shielding member 140 may be disposed on the edge portion of the substrate 700. For example, in an embodiment, the shielding member 140 may include two adjacent plates.

When the substrate 700 does not pass through the organic layer deposition assembly 100-1, the shielding member 140 screens the deposition source 110, and thus, the deposition material 115 discharged from the deposition source 110 does not reach the patterning slit sheet 130. When the substrate 700 enters into the organic layer deposition assembly 100-1 with the shielding member 140 screening the deposition source 110, a front part of the shielding member 140 which screens the deposition source 110 moves along with the movement of the substrate 700, and thus, the flow path of the deposition material 115 is opened and the deposition material 115 discharged from the deposition source 110 passes through the patterning slit sheet 130 and is deposited on the substrate 700. Also, while the substrate 700 passes through the organic layer deposition assembly 100-1, a rear part of the shielding member 140 moves along with the movement of the substrate 700 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 700 is screened by the shielding member 140, and thus, it may be relatively easy to prevent the organic material from being deposited on the non-film-forming region of the substrate 700 without using a separate structure.

Hereinafter, the conveyer unit 400 that conveys the substrate 700, on which the deposition material 115 is to be deposited, is described in more detail. Referring to FIGS. 9 and 10, the conveyer unit 400 includes, for example, the first conveyer unit 410, the second conveyer unit 420, and the moving unit 430.

The first conveyer unit 410 conveys in an in-line manner the moving unit 430, including the carrier 431 and an electrostatic chuck 432 attached thereto, and the substrate 700 attached to the moving unit 430 so that an organic layer may be formed on the substrate 700 by the organic layer deposition assembly 100-1. The first conveyer unit 410 includes, for example, a coil 411, guide members 412, upper magnetically suspended bearings, side magnetically suspended bearings, and gap sensors.

The second conveyer unit 420 returns to the loading unit 200 the moving unit 430 from which the substrate 700 has been separated in the unloading unit 300 after one deposition cycle is completed while the moving unit 430 is passing through the deposition unit 100. The second conveyer unit 420 includes, for example, a coil 421, roller guides 422, and a charging track 423.

The moving unit 430 includes, for example, the carrier 431 that is conveyed along the first conveyer unit 410 and the second conveyer unit 420 and the electrostatic chuck 432 that is combined on a surface of the carrier 431 and to which the substrate 700 is attached.

Hereinafter, each element of the conveyer unit 400 will be described in more detail.

The carrier 431 of the moving unit 430 will now be described in detail.

The carrier 431 includes, for example, a main body part 431a, a magnetic rail 431b, contactless power supply (CPS) modules 431c, a power supply unit 431d, and guide grooves 431e.

The main body part 431a constitutes a base part of the carrier 431 and may be formed of, for example, a magnetic material such as iron. Here, due to a repulsive force between the main body part 431a and the respective upper and side magnetically suspended bearings, which are described below, the carrier 431 may be maintained spaced apart from the guide members 412 by a certain distance.

The guide grooves 431e may be respectively formed at, for example, both sides of the main body part 431a and each may accommodate a guide protrusion of the guide member 412.

The magnetic rail 431b may be formed, for example, along a center line of the main body part 431a in a direction where the main body part 431a proceeds. The magnetic rail 431b and the coil 411, which are described below in more detail, may be combined with each other to constitute a linear motor, and the carrier 431 may be conveyed in an arrow A direction by the linear motor.

The CPS modules 431c and the power supply unit 431d may be respectively formed, for example, on both sides of the magnetic rail 431b in the main body part 431a. The power supply unit 431d includes a battery (e.g., a rechargeable battery) that provides power so that the electrostatic chuck 432 can chuck the substrate 700 and maintains operation. The CPS modules 431c are, for example, wireless charging modules that charge the power supply unit 431d. For example, the charging track 423 formed in the second conveyer unit 420, which are described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include, for example, an electrode embedded in a main body formed of ceramic, in which the electrode is supplied with power. The substrate 700 is attached onto a surface of the main body of the electrostatic chuck 432 as a high voltage is applied to the electrode.

Hereinafter, an operation of the moving unit 430 is described in more detail.

The magnetic rail 431b of the main body part 431a and the coil 411 may be combined with each other to constitute an operation unit. Here, the operation unit may be, for example, a linear motor. The linear motor has a small frictional coefficient, little position error, and a very high degree of position determination, as compared to a conventional slide guide system. As described above, the linear motor may include, for example, the coil 411 and the magnetic rail 431b. The magnetic rail 431b is, for example, linearly disposed on the carrier 431, and a plurality of the coils 411 may be disposed, for example, at an inner side of the chamber 101 by a certain distance so as to face the magnetic rail 431b, As the magnetic rail 431b is disposed on the carrier 431 instead of the coil 411, the carrier 431 may be operable without power being supplied thereto. Here, the coil 411 is included in the ATM box (atmosphere box) in an air atmosphere and the carrier 431 to which the magnetic rail 431b is attached may be moved in the chamber 101 maintained in a vacuum state.

Hereinafter, the first conveyer unit 410 and the moving unit 430 are described in detail.

Referring to FIG. 10, the first conveyer unit 410 conveys the electrostatic chuck 432 that fixes the substrate 700 and conveys the carrier 431 that conveys the electrostatic chuck 432. Here, the first conveyer unit 410 includes, for example, the coil 411, the guide members 412, the upper magnetically suspended bearings, the side magnetically suspended bearings, and the gap sensors (not shown).

The coil 411 and the guide members 412 are formed inside the upper housing 104. For example, the coil 411 is formed in an upper portion of the upper housing 104, and the guide members 412 are respectively formed on both inner sides of the upper housing 104.

The guide members 412 guide the carrier 431 to move in a direction. Here, the guide members 412 are formed to pass through the deposition unit 100.

The side magnetically suspended bearings are each disposed in the guide member 412 so as to respectively correspond to both sides of the carrier 431. The side magnetically suspended bearings cause a distance between the carrier 431 and the guide member 412 so that the carrier 431 is moved along the guide members 412 in non-contact with the guide members 412. That is, a repulsive force R1 occurring between the side magnetically suspended bearing on the left side in FIG. 10 and the carrier 431, which is a magnetic material, and a repulsive force R2 occurring between the side magnetically suspended bearing on the right side in FIG. 10 and the carrier 431, which is a magnetic material, maintain equilibrium. Thus, as a result, there is a constant distance between the carrier 431 and the respective parts of the guide member 412.

Each of the upper magnetically suspended bearings may be disposed in the guide member 412 so as to be above the carrier 431. The upper magnetically suspended bearings allow the carrier 431 to be moved along the guide members 412 in a non-contact state with the accommodation parts and with a distance therebetween maintained constant. That is, a repulsive force R3 occurring between the upper magnetically suspended bearing and the carrier 431, which is a magnetic material, and gravity maintain equilibrium, and thus, there is a constant distance between the carrier 431 and the respective guide members 412.

Each guide member 412 may further include, for example, the gap sensor. The gap sensor may measure a distance between the carrier 431 and the guide member 412. The gap sensor may be disposed at, for example, a side of the side magnetically suspended bearing. The gap sensor may measure a distance between a side surface of the carrier 431 and the side magnetically suspended bearing.

Magnetic forces of the upper and side magnetically suspended bearings may vary according to values measured by the gap sensors, and thus, distances between the carrier 431 and the respective guide members 412 may be adjusted in real time. That is, a precise transfer of the carrier 431 may be feedback controlled using the upper and side magnetically suspended bearings and the gap sensors.

Hereinafter, the second conveyer unit 420 and the moving unit 430 are described in detail.

Referring back to FIG. 10, the second conveyer unit 420 returns the electrostatic chuck 432 from which the substrate 700 has been separated in the unloading unit 300 and the carrier 431 that carries the electrostatic chuck 432 to the loading unit 200. Here, the second conveyer unit 420 includes, for example, the coil 421, the roller guides 422, and the charging track 423.

For example, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Here, the coil 421 may be disposed in an ATM box, as the coil 411 of the first conveyer unit 410.

Like the first conveyer unit 410, the second conveyer unit 420 may include, for example, the coil 421. Also, the Magnetic rail 431b of the main body part 431a of the carrier 431 and the coil 421 are combined with each other to constitute an operation unit. In this regard, the operation unit may be, for example, a linear motor. The carrier 431 may be moved by the linear motor along a direction opposite to the direction of arrow A illustrated in FIG. 9.

The roller guides 422 guide the carrier 431 to move in a direction. Here, the roller guides 422 are formed to pass through the deposition unit 100.

As a result, the second conveyer unit 420 is used in a process of returning the carrier 431 from which the substrate 700 has been separated and not in a process of depositing an organic material on the substrate 700, and thus, position accuracy thereof is not needed as by the first conveyer unit 410. Therefore, magnetic suspension is applied to the first conveyer unit 410 that may require high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. In addition, the magnetic suspension may also be applied to the second conveyer unit 420 as in the first conveyer unit 410.

The organic layer deposition assembly 100-1 of the organic layer deposition apparatus 1 according to the present embodiment may further include, for example, the camera 170 and the sensor 180 for an aligning process. For example, the camera 170 may align in real time a first alignment mark formed in the frame 135 of the patterning slit sheet 130 and a second alignment mark (not formed on the substrate 700. Here, the camera 170 is disposed to more accurately view in the chamber 101 maintained in the vacuum state during deposition. For this, the camera 170 may be installed in a camera accommodation unit 171 in an atmospheric state.

As the substrate 700 and the patterning slit sheet 130 are spaced apart from each other by a certain distance, distances to the substrate 700 and the patterning slit sheet 130 that are disposed at different positions should be both measured using the camera 170. For this operation, the organic layer deposition assembly 100-1 of the organic layer deposition apparatus 1 may include, for example, the sensor 180. Here, the sensor 180 may be, for example, a confocal sensor. The confocal sensor may scan an object to be measured by, for example, using laser beams that rotate at high speed and a scanning mirror and then measuring a distance to the object by using fluorescent or reflected rays emitted by the laser beams. The confocal sensor may measure a distance by, for example, sensing a boundary interface between different media.

As a distance between the substrate 700 and the patterning slit sheet 130 is measurable in real time using the camera 170 and the sensor 180, the substrate 700 may be aligned with the patterning slit sheet 130 in real time, thereby significantly increasing the positional accuracy of a pattern.

Figure 11:
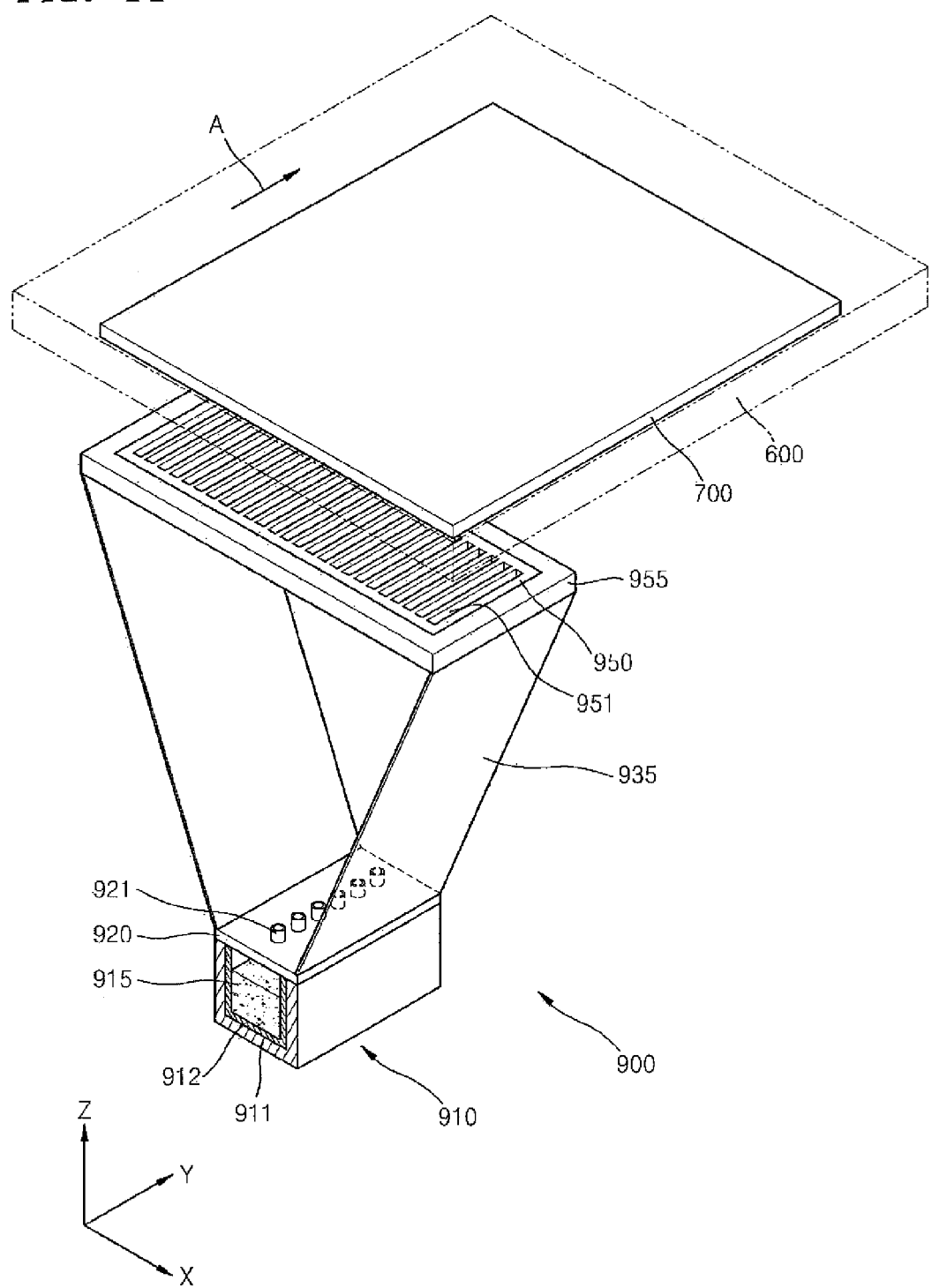
FIG. 11 is a schematic perspective view of an organic layer deposition assembly according to act embodiment of the present invention.

FIG. 11 is a schematic perspective view of an organic layer deposition assembly according to an embodiment of the present invention.

Referring to FIG. 11, an organic layer deposition assembly 900 includes, for example, a deposition source 910, a deposition source nozzle unit 920, and a patterning slit sheet 950.

The deposition source 910 includes, for example, a crucible 911 that is filled with a deposition material 915, and a heater 912 that heats the crucible 911 to vaporize the deposition material 915, which is contained in the crucible 911, toward the deposition source nozzle unit 920. The deposition source nozzle unit 920 is disposed, for example, at a side of the deposition source 910. The deposition source nozzle unit 920 includes, for example, a plurality of deposition source nozzles 921 arranged in the Y-axis direction. The patterning slit sheet 950 and a frame 955 are further disposed between the deposition source 910 and a substrate 500. The patterning slit sheet 950 includes, for example, a plurality of patterning slits 951 that are arranged in the X-axis direction. In addition, the deposition source 910 and the deposition source nozzle unit 920 may be connected to the patterning slit sheet 950 by, for example, a connection member 935.

The deposition source nozzle unit 920 is disposed at a side of the deposition source 910, and in particular, at the side of the deposition source 910 facing the substrate 700. The deposition source nozzle unit 920 includes, for example, the deposition source nozzles 921 that may be arranged in the Y-axis direction, e.g., a scanning direction of the substrate 700. Here, the plurality of deposition source nozzles 921 may be arranged, for example, such that the distance between each of adjacent pairs of the deposition source nozzles 921 is the same as one another. The deposition material 915 that is vaporized in the deposition source 910 passes through the deposition source nozzle unit 920 towards the substrate 700 that is a deposition target substrate. As described above, when the deposition source nozzle unit 920 includes the deposition source nozzles 921 arranged in the Y-axis direction, that is, the scanning direction of the substrate 700, the size of a pattern formed of the deposition material 915 discharged through each of a plurality of patterning slits 951 of the patterning slit sheet 950 is affected by the size of one of the deposition source nozzles 921 (as there is only one line of the deposition source nozzles 921 in the X-axis direction). Thus, no shadow may be formed on the substrate 700. In addition, as the deposition source nozzles 921 are arranged in the scanning direction of the substrate 700, even if there is a difference in flux between the deposition source nozzles 921, the difference may be compensated for and deposition uniformity may be maintained constant.

Figure 12:
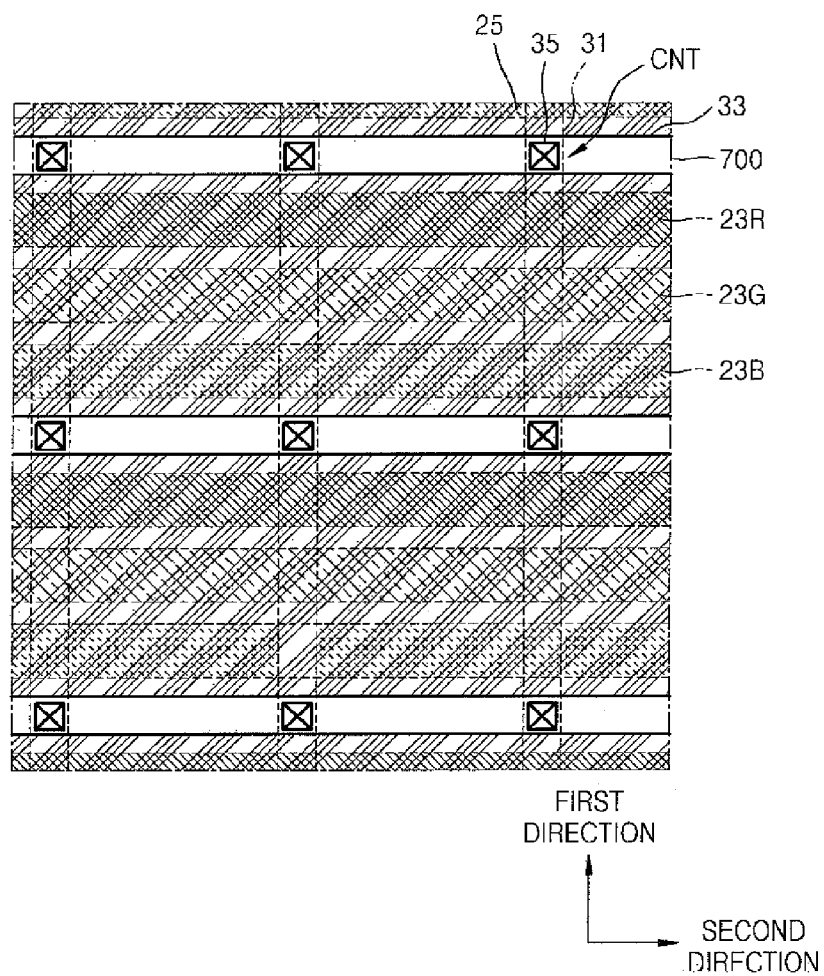
FIG. 12 is a view illustrating a method for manufacturing an organic light emitting display apparatus by using the organic layer deposition apparatus of FIGS. 7 to 11.

FIG. 12 is a view illustrating a method for manufacturing an organic light emitting display apparatus by using the organic layer deposition apparatus of FIGS. 7 to 11.

A driving circuit including a thin film transistor TFT and a first electrode (see reference numeral 21 of FIG. 3) are formed on a substrate 700.

A lower auxiliary electrode 31 having, for example, a line shape is formed on the same layer as the first electrode 21 in a first direction.

As described above, an organic layer deposition apparatus 1 according to an embodiment of the present invention includes a patterning slit sheet having a size significantly less than that of a typical FMM. While the organic layer deposition apparatus 1 and the substrate 700 are relatively moved with respect to each other, deposition may be performed. That is, while the substrate 700 is moved in one direction, the deposition may be performed in a scanning manner.

While the substrate 700 and the organic layer deposition apparatus 1 are moved in a certain direction with respect to each other in a state where the substrate 700 and the organic layer deposition apparatus 1 are spaced a predetermined distance from each other by using the organic layer deposition apparatus 1 that is disclosed in FIGS. 7 to 11, a lower auxiliary electrode formation material evaporated from a deposition source (see reference numeral 120 of FIG. 7 and reference numeral 910 of FIG. 11) of the organic layer deposition apparatus may pass through the patterning slit sheet (reference numeral 130 of FIG. 7 and reference numeral 950 of FIG. 11) and then be deposited on the substrate 700 to form the lower auxiliary electrode 31.

An organic layer (see reference numeral 23 of FIG. 3) and a second electrode 25 that is a common layer are formed above the lower auxiliary electrode 31 and the first electrode 21.

For example, a fourth insulating layer (see reference numeral 107 of FIG. 3) that functions as a pixel define layer is formed on the lower auxiliary electrode 31 and the first electrode 21. An opening for exposing the first electrode 21 and a contact hole 35 for exposing the lower auxiliary electrode 31 in a contact unit CNT are formed in the fourth insulating layer 107.

The organic layer 23 is formed on the first electrode 21 and the fourth insulating layer 107.

While the substrate 700 and the organic layer deposition apparatus 1 are moved in a certain direction with respect to each other in a state where the substrate 700 and the organic layer deposition apparatus 1 are spaced a predetermined distance from each other by using the organic layer deposition apparatus 1 that is disclosed in FIGS. 7 to 11, a deposition material evaporated from the deposition source 120 or 190 of the organic layer deposition apparatus 1 may pass through the patterning slit sheet 130 or 950 and then be deposited on the substrate 700 to form the organic layer 23. Thus, the organic layer 23 may be continuously formed in, for example, a line shape on the substrate 700 on which the deposition process is performed.

In an embodiment, for example, an EML may use the patterning slit sheet 130 or 950 as a deposition mask, and the functional layer may use an open mask as a deposition mask. Thus, the functional layer of the organic layer 23 may be formed as a common layer on the substrate 700 on which the deposition process is performed. As illustrated in FIG. 12, the EML of the organic layer 23 may include, for example, a red EML 23R, a green EML 23G, and a blue EML 23B, each having a line shape, which are continuously formed adjacent to each other.

The organic layer 23 formed on the contact unit CNT may be removed by using, for example, laser beams. Thus, the organic layer 23 may not remain in the contact hole 35 of the contact unit CNT.

Also, the second electrode 25 is formed above the fourth insulating layer 107, the organic layer 23, and the lower auxiliary electrode 31. While the substrate 700 and the organic layer deposition apparatus 1 are moved in a certain direction with respect to each other in a state where the substrate 700 and the organic layer deposition apparatus 1 are spaced a predetermined distance from each other by using the organic layer deposition apparatus that is disclosed in FIGS. 7 to 11, a second electrode formation material evaporated from the deposition source 120 or 190 of the organic layer deposition apparatus may pass through the open mask and then be deposited on the substrate 700 to form the second electrode 25. The second electrode 25 may directly contact the lower auxiliary electrode 31 through the contact hole 35 in the contact unit CNT.

An upper auxiliary electrode 33 having, for example, a line shape is formed on the second electrode 25 in a second direction. While the substrate 700 is rotated at an angle of, for example, about 90 degrees with respect to a position thereof when the lower auxiliary electrode 31 is formed, and then, the substrate 700 and the organic layer deposition apparatus are moved in a certain direction with respect to each other in a state where the substrate 700 and the organic layer deposition apparatus are spaced a predetermined distance from each other by using the organic layer deposition apparatus that is disclosed in FIGS. 7 to 11, an upper electrode formation material evaporated from the deposition source 120 or 190 of the organic layer deposition apparatus may pass through the patterning slit sheet 130 or 950 and then be deposited on the substrate 700 to form the upper auxiliary electrode 33. The upper auxiliary electrode 33 directly contacts the second electrode 25 in the contact unit CNT.

According to embodiments of the present invention, the auxiliary electrode may be used to prevent the electrical properties of the display apparatus from be deteriorated. Also, the lower auxiliary electrode disposed under the second electrode and the upper auxiliary electrode disposed on the second electrode are arranged in the mesh shape to reduce the voltage drop of the second electrode.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light emitting display apparatus comprising:
   a plurality of first electrodes disposed in each of a plurality of pixels on a substrate;
   a plurality of lower auxiliary electrodes insulated from the first electrodes, wherein the plurality of lower auxiliary electrodes are disposed in a line shape in a first direction;
   at least one organic layer disposed on the plurality of first electrodes;
   a second electrode facing the plurality of first electrodes and covering the organic layer, wherein the second electrode is disposed on substantially an entire surface of the substrate; and
   a plurality of upper auxiliary electrodes disposed on the second electrode in a line shape in a second direction electrode is disposed on substantially an entire surface of the substrate; and
   a plurality of upper auxiliary electrodes disposed on the second electrode in a line shape in a second direction which is perpendicular to the first direction, without overlapping the plurality of first electrodes,
   wherein the second electrode is disposed between the plurality of lower auxiliary electrodes and the plurality of upper auxiliary electrodes, and directly contacts both the lower auxiliary electrodes and the upper auxiliary electrodes in regions in which each of the plurality of lower auxiliary electrodes cross each of the plurality of upper auxiliary electrodes.

2. The organic light emitting display apparatus of claim 1, further comprising a pixel define layer disposed between the plurality of first electrodes,
   wherein the second electrode contacts each of the plurality of lower auxiliary electrodes through contact holes in the pixel define layer.

3. The organic light emitting display apparatus of claim 1, further comprising a plurality of organic layers disposed on the first electrodes in a line shape,
   wherein the plurality of lower auxiliary electrodes are disposed in the line shape in a direction crossing the organic layers, and
   wherein the plurality of upper auxiliary electrodes are disposed in the line shape between the organic layers adjacent to each other.

4. An organic light emitting display apparatus comprising:
   a plurality of pixels each comprising a first electrode, a second electrode opposite to the first electrode, and at least one organic layer disposed between the first and second electrodes;
   a plurality of lower auxiliary electrodes disposed below the second electrode and contacting the second electrode, wherein the plurality of lower auxiliary electrodes are disposed in a line shape between at least one pixel column; and
   a plurality of upper auxiliary electrodes disposed above the second electrode and contacting the second electrode, wherein the plurality of upper auxiliary electrodes are disposed in a line shape between at least one pixel row without overlapping the plurality of first electrodes, and
   wherein the second electrode directly contacts both the plurality of lower auxiliary electrodes and the plurality of upper auxiliary electrodes in regions in which the plurality of lower auxiliary electrodes cross the plurality of upper auxiliary electrodes.

5. The organic light emitting display apparatus of claim 4, wherein the second electrode contacts each of the plurality of lower auxiliary electrodes through contact holes in an insulation layer.

* * * * *